(12) United States Patent
Last et al.

(10) Patent No.: US 11,206,732 B2
(45) Date of Patent: Dec. 21, 2021

(54) RELIABLE INTERCONNECT FOR CAMERA IMAGE SENSORS

(71) Applicant: Waymo LLC, Mountain View, CA (US)

(72) Inventors: Matthew Last, Mountain View, CA (US); Unique Rahangdale, Mountain View, CA (US); Giulia Guidi, Mountain View, CA (US); Roya Mirhosseini-Schubert, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 27 days.

(21) Appl. No.: 16/460,963

(22) Filed: Jul. 2, 2019

(65) Prior Publication Data

US 2021/0007216 A1 Jan. 7, 2021

(51) Int. Cl.
*H05K 7/10* (2006.01)
*H05K 7/12* (2006.01)
*H05K 1/02* (2006.01)
*H05K 1/11* (2006.01)
*H05K 3/46* (2006.01)
(Continued)

(52) U.S. Cl.
CPC ......... *H05K 1/0271* (2013.01); *H05K 1/0201* (2013.01); *H05K 1/111* (2013.01); *H05K 1/117* (2013.01); *H05K 1/181* (2013.01); *H05K 3/107* (2013.01); *H05K 3/4644* (2013.01); *H05K 2201/09445* (2013.01); *H05K 2201/10121* (2013.01); *H05K 2201/10151* (2013.01); *H05K 2201/10568* (2013.01)

(58) Field of Classification Search
USPC .......................................................... 361/767
See application file for complete search history.

(56) References Cited

U.S. PATENT DOCUMENTS 6,683,298 B1 * 1/2004 Hunter ................. H04N 5/2253
250/239
9,838,600 B1 * 12/2017 Tam .................... H04N 5/23238
(Continued)

FOREIGN PATENT DOCUMENTS

CN        102005437 A      4/2011
KR        20140016023      2/2014
(Continued)

OTHER PUBLICATIONS

International Searching Authority, International Search Report and Written Opinion dated Oct. 6, 2020, issued in connection with International Patent Application No. PCT/US2020/039538 filed on Jun. 25, 2020, 10 pages.

*Primary Examiner* — Andargie M Aychillhum
(74) *Attorney, Agent, or Firm* — McDonnell Boehnen Hulbert & Berghoff LLP

(57) ABSTRACT

The present disclosure relates to optical systems and methods of their manufacture. An example system includes a printed circuit board assembly (PCBA) and an image sensor package coupled to the PCBA by way of a plurality of bond members. The system additionally includes a sensor holder coupled to the PCBA. The image sensor package and the sensor holder are coupled to the PCBA so as to minimize thermally-induced stresses in at least one of: the plurality of bond members, the PCBA, the sensor holder, or the image sensor package.

18 Claims, 14 Drawing Sheets

(51) Int. Cl.
  *H05K 3/10* (2006.01)
  *H05K 1/18* (2006.01)

(56) References Cited

U.S. PATENT DOCUMENTS

| | | |
|---|---|---|
| 2007/0238220 A1 | 10/2007 | Lii et al. |
| 2008/0164550 A1* | 7/2008 | Chen ................ H01L 27/14683 |
| | | 257/432 |
| 2008/0290435 A1 | 11/2008 | Oliver et al. |
| 2009/0032925 A1 | 2/2009 | England |
| 2009/0053850 A1 | 2/2009 | Nishida et al. |
| 2016/0086893 A1 | 3/2016 | Wu et al. |
| 2016/0284752 A1 | 9/2016 | Shi |
| 2017/0294469 A1 | 10/2017 | Lee et al. |
| 2017/0345864 A1 | 11/2017 | Kinsman et al. |
| 2018/0042106 A1* | 2/2018 | Scheja ................ H04N 5/2253 |
| 2020/0052019 A1* | 2/2020 | Yeh .................... H01L 27/14685 |
| 2020/0204711 A1* | 6/2020 | Guidi .................. H04N 5/2254 |

FOREIGN PATENT DOCUMENTS

| | | |
|---|---|---|
| TW | 200822721 A | 5/2008 |
| TW | 201340798 A | 10/2013 |

\* cited by examiner

| MODEL | Total Strain | Max Von-Mises stress critical solder joint (MPa) | Volume average strain energy density per cycle of critical solder ΔW (MPa) | Schubert's model Life (cycles) | Syed's model Life (cycles) | Rel Test life |
|---|---|---|---|---|---|---|
| LGA old PCB | 0.040 | 87.57 | 0.764 | 300 | 300 | 300 |
| LGA new PCB | 0.045 | 85.43 | 0.610 | 375 | 370 | |
| LGA new+Underfill | 0.009 | 72.89 | 0.162 | ~1000 | ~1000 | |
| BGA new PCB | 0.0536 | 83.5 | 0.236 | 994 | 887 | |

RELIABLE INTERCONNECT FOR CAMERA IMAGE SENSORS

BACKGROUND

Conventional image sensors often include a plurality of different materials having different respective coefficients of thermal expansion (CTE). For example, image sensor substrates can be coupled to ceramic or plastic carrier substrates, which could be coupled by way of Land Grid Array (LGA) solder pads to a printed circuit board. In some cases, problems may result due to 1) a mismatch between a CTE of the image sensor and a CTE of the image sensor package; 2) a mismatch between a CTE of the sensor package and a CTE of the substrate; and/or 3) a CTE mismatch between components that are coupled together. For example, if the forces due to the CTE mismatch are strong enough (e.g., due to thermal shock), then the solder joints attaching sensor LGA pad to the printed circuit board can crack and/or delaminate.

SUMMARY

The present disclosure describes methods and devices that improve thermal shock performance of image sensor systems by reducing or eliminating cracks and/or delamination of solder joints. For example, the present disclosure includes several methods for reducing the stress on the solder joints when ceramic or plastic LGA packages are attached to Printed Circuit Board Assemblies (PCBAs).

In a first aspect, a system is provided. The system includes a printed circuit board assembly (PCBA) and an image sensor package coupled to the PCBA by way of a plurality of bond members. The system also includes a sensor holder coupled to the PCBA. The image sensor package and the sensor holder are coupled to the PCBA so as to minimize thermally-induced stresses in at least one of: the plurality of bond members, the PCBA, the sensor holder, or the image sensor package.

In a second aspect, a method of manufacturing an optical system is provided. The method includes coupling an image sensor package to a printed circuit board assembly (PCBA) by way of a plurality of bond members. The method also includes coupling a sensor holder to the PCBA. The image sensor package and the sensor holder are coupled to the PCBA so as to minimize thermally-induced stresses in at least one of: the plurality of bond members, the PCBA, the sensor holder, or the image sensor package.

Other aspects, embodiments, and implementations will become apparent to those of ordinary skill in the art by reading the following detailed description, with reference where appropriate to the accompanying drawings.

BRIEF DESCRIPTION OF THE FIGURES

FIG. 7 illustrates a comparison between several system configurations, according to example embodiments.

DETAILED DESCRIPTION

Figure 1:
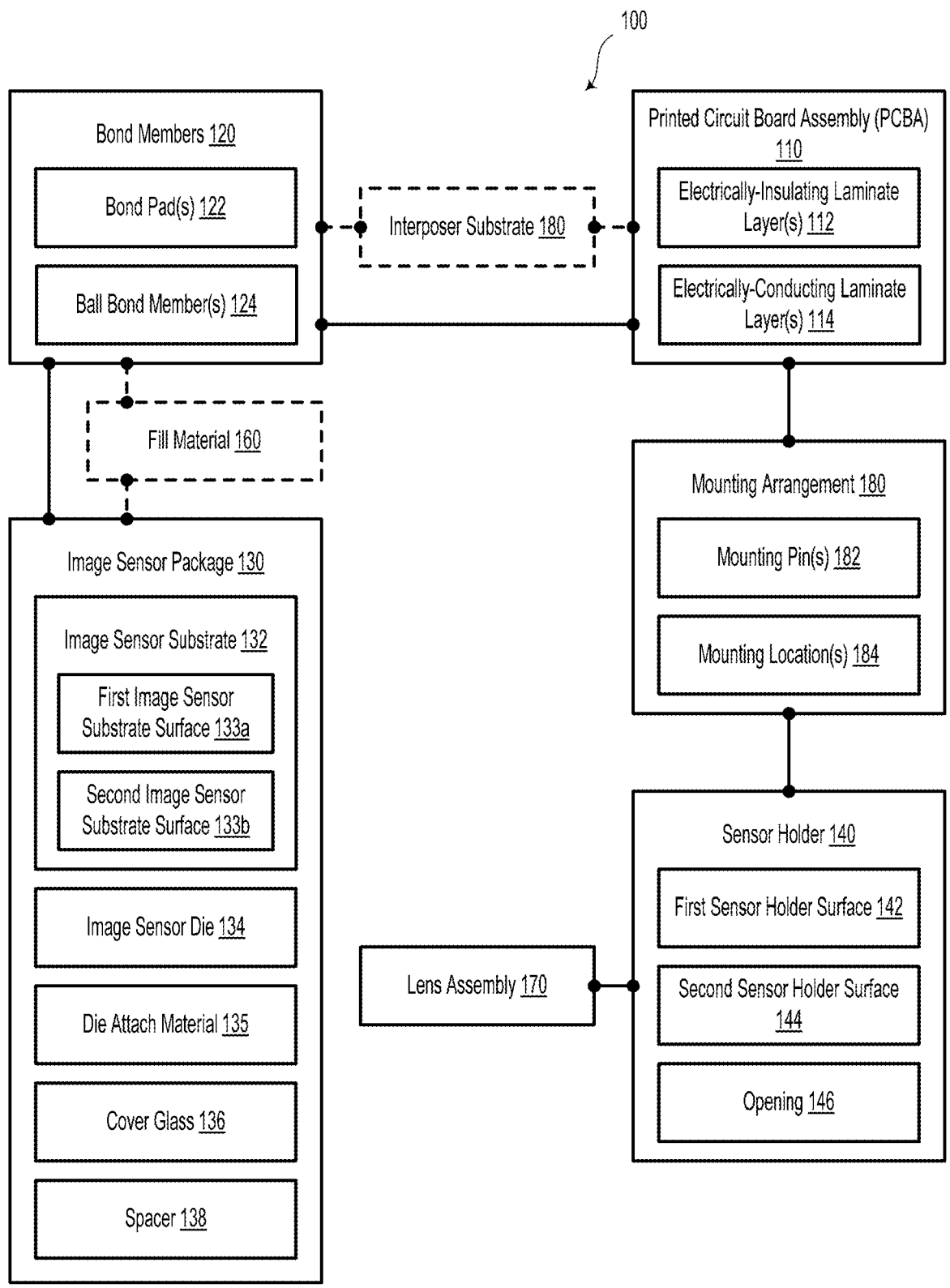
FIG. 1 illustrates a system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

The present disclosure includes several methods for reducing the stress on the solder joints when ceramic or plastic Land Grid Array (LGA) packages are attached to Printed Circuit Board Assemblies (PCBAs).

In example embodiments, solder balls could be attached to LGA pads to increase the stand-off height of the solder joint. This can be done as part of the original manufacturing process or as a secondary operation on finished image sensor chips.

In some embodiments, the solder ball material can be changed to a softer, polymer core solder ball.

In yet further embodiments, an underfill material and/or underfill pattern can be utilized to add additional surface contact between the sensor package and the PCB so as to provide improved performance under shock and vibration conditions.

Additionally or alternatively, the PCB material and/or one or more materials in a PCB stack can be adjusted to or substituted with a material with a lower CTE. Various such materials are available, as described herein.

In various embodiments, an intermediate interposer PCB may be inserted or interposed between the ceramic or plastic substrate and the PCB. The interposer PCB can be made of low-CTE material that servers as an intermediate CTE material between the two interfaces, and/or it can contain solder balls on the bottom surface and/or the top surface.

In other embodiments, a camera holder mount pattern may be selected to reduce stress between PCB and image sensor package. For example, coupling locations may be specifically selected between a sensor holder and the PCB so as to minimize the potential for stress-related failure of such a coupling.

In general, the disclosed devices and methods may reduce or eliminate instances of cracking or other structural failures due to CTE mismatch between an image sensor and a ceramic or plastic carrier.

II. Example Optical Systems

FIG. 1 illustrates a system 100, according to an example embodiment. The system 100 includes a printed circuit board assembly (PCBA) 110. In various embodiments, the PCBA 110 could include a plurality of electrically-insulating laminate layers 112 and/or a plurality of electrically-conducting laminate layers 114.

In various embodiments, the system 100 additionally includes an image sensor package 130 coupled to the PCBA 110 by way of a plurality of bond members 120. The image sensor package 130 includes an image sensor substrate 132 and an image sensor die 134.

In example embodiments, the system 100 includes a sensor holder 140 that is coupled to the PCBA 110. In various embodiments, the sensor holder 140 could be configured to maintain a relative position of the image sensor package 130 along an optical axis of a lens assembly 170 and substantially at a focal plane of the lens assembly 170. In some embodiments, the sensor holder 140 could be formed from plastic, aluminum, steel, ceramic, carbon fiber, composite materials, or another type of rigid material. At least a portion of the sensor holder 140 could have a flat plate-like shape and could include an opening 146 to provide physical and optical access for the image sensor die 134. In an example embodiment, the sensor holder 140 could include a rectangular or square plate of material with a rectangular or square opening for optical access to the image sensor die 134. In an example embodiment, the sensor holder 140 could be between 2 millimeters and 5 millimeters thick, although other thicknesses and dimensions of the sensor holder 140 are contemplated.

In some scenarios, at least one of the image sensor package 130 or the sensor holder 140 are coupled to the PCBA 110 so as to minimize thermally-induced stresses in at least one of: the plurality of bond members 120, the PCBA 110, the sensor holder 140, or the image sensor package 130. In some embodiments, one or more of the PCBA 110, the sensor holder 140, or the image sensor package 130 could be positioned and/or coupled to one another by way of an active alignment bond. In such scenarios, the active alignment bond could include epoxy or another type of adhesive. As an example, the active alignment bond could be formed using an active alignment process. In such a scenario, the active alignment process could include causing the image sensor die 134 to image a scene through the lens assembly 170. The active alignment process could additionally include adjusting a fine alignment position of the image sensor based on the images, which could include a real-time alignment process. In such examples, the active alignment process could adjust a position of the image sensor die 134 so that it is substantially located at the focal plane of the lens assembly 170. For example, the active alignment process could include a stepper motor configured to adjust a position of the image sensor die 134 (and/or the image sensor package 130) until it provides images indicating that the image sensor die 134 is substantially located at the focal plane (for example by providing in-focus images of a calibration target). Thereafter, an epoxy material could be applied to an opening or a joint between the lens assembly 170 and sensor holder 140 (e.g., along the first sensor holder surface 142) and/or between the image sensor package 130 and the sensor holder 140. Additionally or alternatively, application of the active alignment bond could occur elsewhere within system 100 so as to fix the relative position of two or more other elements of the system 100, as contemplated within the scope of the present disclosure.

In some embodiments, at least one bond member 120 of the plurality of bond members could include a respective bond pad 122 coupled to a surface of the image sensor package 130. In such examples, a respective ball bond member 124 could be coupled between the respective bond pad 122 and the PCBA 110.

In example embodiments, the PCBA 110 has a PCBA planar coefficient of thermal expansion (CTE). Additionally, the image sensor package 130 has an image sensor planar CTE. In such scenarios, the PCBA planar CTE could be substantially similar to the image sensor planar CTE. That is, the PCBA planar CTE could be selected to be similar (e.g., within 10%, 5%, 1%, or 0.1%) to the image sensor planar CTE.

In some embodiments, the image sensor package 130 could include an image sensor substrate 132 having a first image sensor substrate surface 133a and a second image sensor substrate surface 133b. In an example embodiment, the image sensor substrate 132 could be formed from a ceramic or plastic material. For example, the image sensor substrate 132 could include an alumina (e.g., $Al_2O_3$) material or another type of semiconductor device packaging material. Additionally or alternatively, the image sensor substrate 132 could include a glass-reinforced epoxy laminate material, such as FR-4. Other types of rigid substrate materials are possible and contemplated in the present disclosure.

In example embodiments, the image sensor die 134 could be coupled to the first image sensor substrate surface 133a by way of a die attach material 135. The image sensor die 134 could include a focal plane array or another type of multi-element photodetector sensor. For example, the image sensor die 134 could include a plurality of charge-coupled device (CCD) elements and/or a plurality of complementary metal-oxide-semiconductor (CMOS) elements. In some embodiments, the system 100 could include a plurality of image sensor dies. In an example embodiment, the image sensor die 134 could be configured to detect light in the infrared spectrum (e.g., about 700 nanometers to about 1000 nanometers) and/or within the visible spectrum (e.g., about 400 nanometers to about 700 nanometers). Using the image sensor die 134 to sense light in other spectral ranges (e.g., long-wavelength infrared (LWIR) light having wavelengths between 8-12 microns) is possible and contemplated herein.

The image sensor die 134 could be configured (e.g., sized or dimensioned) according to an image sensor format. For example, the image sensor die 134 could include a full-frame (e.g., 35 millimeter) format sensor. Additionally or alternatively, the image sensor die 134 could include "crop sensor" formats, such as APS-C (e.g., 28.4 mm diagonal) or one inch (e.g., 15.86 mm diagonal) formats. Other image sensor formats are contemplated and possible within the scope of the present disclosure.

Additionally or alternatively, in various embodiments, the image sensor package 130 could include a cover glass 136 and a spacer 138. In such scenarios, the spacer 138 could be disposed about a perimeter of the image sensor die 134. Furthermore, the spacer 138 could be disposed between the first image sensor substrate surface 133*a* and a surface of the cover glass 136 (e.g., a surface proximal to the image sensor die 134).

In some embodiments, the second image sensor substrate surface 133*b* could include a plurality of land grid array (LGA) pads. It will be understood that while an LGA arrangement is described herein, other ways to electrically and/or physically couple one or more elements of system 100 are possible and contemplated. For example, embodiments may include, without limitation, a ball grid array (BGA), a pin grid array (PGA), surface mount pads, wire bonds, and/or other types of electrical and/or physical connections.

In various examples, at least a portion of a cavity between the PCBA 110 and the image sensor package 130 could be filled with a fill material 160. In some embodiments, the fill material 160 could include at least one of an epoxy material or a CTE-matching material. In related embodiments, the fill material 160 could substantially fill the cavity between the PCBA 110 and the image sensor package 130 according to a fill pattern. The fill pattern could include at least one of: a full area fill, a corner area fill, or a corner edge bond. Example fill patterns are illustrated and described with reference to FIG. 4.

In some embodiments, the system 100 could include a lens assembly 170 coupled to the sensor holder 140. In such scenarios, the sensor holder 140 could include an opening 146 configured to provide optical access between the lens assembly 170 and the image sensor package 130 and/or the image sensor die 134. In some examples, the lens assembly 170 could include at least one lens. The lens assembly 170 and the at least one lens could define an optical axis (e.g., optical axis 202 as illustrated and described in relation to FIGS. 2A and 2B), a focal distance, and/or a corresponding focal plane. The at least one lens could include one or more plano-convex lenses, a prism lens, a cylindrical lens, a conical lens, and/or other type of lens.

In some embodiments, the focal plane of the lens assembly 170 could be represented by a plane perpendicular to the optical axis 202 and that intersects the optical axis 202 at the focal distance defined by the lens assembly 170. In some embodiments, the focal plane could represent a plane along which a surface (or another feature) of the image sensor die 134 could be positioned so as to obtain images with an optimal focus.

In some examples, the lens assembly 170 and/or its corresponding lens(es) could provide an f-number less than or equal to 2.8. The f-number can be defined by the focal distance divided by a diameter of an aperture of the lens assembly 170.

In various examples, the focal distance could be a fixed focal length. That is, the focal distance could be substantially invariant during normal operation of the system 100. In such scenarios, the system 100 could be a fixed-focal length system (e.g., a system that does not include an auto-focus mechanism). Such a fixed-focal length system may beneficially provide real-time imaging with higher reliability than auto-focused systems and without auto-focus time lag. However, it will be understood that embodiments with a lens assembly 170 having a variable-focal length and/or auto-focus functionality are also contemplated and possible within the scope of the present disclosure.

In example embodiments, the sensor holder 140 could be attached to the PCBA 110 by way of a mounting arrangement 180. In such scenarios, the mounting arrangement 180 could include a plurality of mounting pins 182 that couple the sensor holder 140 to the PCBA 110 at a plurality of mounting locations 184. Furthermore, in some embodiments, the mounting arrangement 180 could be determined and/or selected so as to minimize thermally-induced stress between the PCBA 110 and the sensor holder 140.

In some embodiments, the plurality of mounting pins 182 could extend from a second sensor holder surface 144 toward and through the PCBA 110. In some embodiments, the plurality of mounting pins 182 could extend through the PCBA 110. In such scenarios, the plurality of mounting pins 182 could be press-fit, screwed, or tightened with a nut to secure the sensor holder 140 to the PCBA 110.

In other embodiments, the sensor holder 140 could be coupled to a surface of the PCBA 110 by way of a plurality of fasteners. In such scenarios, the sensor holder 140 could include one or more threaded or straight-wall through holes. The plurality of fasteners could include, for example, at least two threaded bolts. The fasteners could be formed of aluminum, steel, or another type of structural material. In some embodiments, the fastener material could be selected so as to minimize CTE mismatch and/or to mitigate thermally-induced stress between the sensor holder 140 and the PCBA 110.

In such examples, the respective bolts could pass through the PCBA 110 and thread into through holes of the sensor holder 140. In such a scenario, the bolt head of the fasteners could abut a second surface of the PCBA 110 and thread into the sensor holder 140. In this way, a compressive coupling force could be applied to the PCBA 110 and the sensor holder 140. However, other ways of applying a compressive coupling force to the PCBA 110 and the sensor holder 140 are possible and are contemplated within the present disclosure. In such examples, the sensor holder 140 could prevent movement of the PCBA 110 and the image sensor package 130 with respect to the lens assembly 170 that may be caused by thermal-cycle-induced debowing or destressing.

In various example embodiments, the sensor holder 140 could be configured to maintain a position of the image sensor package 130 and/or the image sensor die 134 within 10 microns of the focal plane of the lens assembly 170. In other embodiments, the sensor holder 140 could be configured to maintain a position of the image sensor package 130 within 2 microns, 5 microns, 20 microns, 50 microns, or another distance relative to the focal plane.

In some examples, the sensor holder 140 could be configured to maintain a position of the image sensor package 130 with respect to the lens assembly 170 over at least 25 thermal cycles between −40° C. to 85° C.

In some examples, the mounting arrangement 180 could include three mounting locations 184 disposed in a non-equilateral triangle with respect to the image sensor package 130. Example mounting arrangements 180 are illustrated and described in relation to FIG. 3.

In example embodiments, the system 100 could also include a housing. The housing could include, among other possibilities, an external protective surface or coating. The housing could include, for example, an outer shell or wall of the system 100. In some embodiments, the housing could include an acrylic material formed in a sheet, dome, cylinder, or another shape. Other rigid materials that could form the housing are possible and contemplated. In such scenarios, the system 100 could include a thermal transfer material that is arranged between the PCBA 110 and the housing. In example embodiments, the thermal transfer material could include a material having a thermal conductivity of at least 1.0, 1.5, 2.0, or 5.0 W/(m·K), or a within range between 1.0 to 10.0 W/(m·K). In some embodiments, the thermal transfer material could include a thermal gap pad. As an example, the thermal gap pad could be formed from a silicone elastomer material and could include one or more tacky surfaces. In addition, the thermal gap pad could include an unreinforced gap-filling material (e.g., such as the Gap Pad® 1500 available from The Bergquist Company). The thermal gap pad could have a thermal conductivity of 1.5 W/m-K and could be conformable with a low-hardness texture. However, other types of thermal transfer materials are contemplated and possible within the scope of the present disclosure.

In general, the elements of system 100 could include at least some different materials. For example, the image sensor die 134 could include a semiconductor material, such as silicon or gallium arsenide. In some instances, the image sensor die 134 could be packaged in an alumina package. The bond members 120 could include gold-plated copper, aluminum, and/or other electrically- and/or thermally-conductive metal materials. The PCBA 110 could include a printed circuit board material, such as FR-4.

In an example embodiment, each element of the system 100 could have a different coefficient of thermal expansion (CTE). The CTE could include a measure of how the size of a given object changes with a change in temperature. For example, the CTE for each material could include the fractional change in size (e.g., length and/or volume) per degree change in temperature for a given pressure. For example, an alumina sensor package (e.g., image sensor package 130) could have a CTE of approximately 7 ppm/° C., whereas a printed circuit board (e.g., PCBA 110) could have a CTE of approximately 14 ppm/° C.

One or more elements of system 100 could be selected and/or utilized to achieve passive athermalization of at least portions of system 100. For example, materials of systems 100 could be selected so as to reduce the temperature and stress-related movement of certain parts (e.g., PCBA 110 and image sensor package 130) with respect to others (e.g., lens assembly 170 and/or sensor holder 140) as described in the present disclosure. In particular, the various material CTEs could be taken into account when designing the system 100.

As described herein, the CTEs of materials and mismatched CTEs at material interfaces could result in image plane displacement, warpage, and/or tilt of various components of system 100 as a function of stress. In some embodiments, it may be desirable to substantially match CTEs at one or more material interfaces (e.g., interfaces including the image sensor, image sensor package, substrate/PCB, PCBA, etc.). For example, the respective CTEs of material at such interfaces could be adjusted or selected so as to be as close to one another as possible to reduce failure in reliability and undesirable optical defocusing due to temperature-dependent stresses.

In an example embodiment, the CTEs of various materials physically coupled to and/or proximate to one another in system 100 could be selected so that the combination of the CTE differences is substantially zero. For example, the combined CTE of the lens assembly 170, active alignment bond, and the sensor holder 140 could be equal to the combined CTE of the bond members 120, image sensor package 130, one or more lenses of lens assembly 170, and/or a temperature dependent focal length of such lenses. In one approach to achieve differential CTE compensation for system 100, materials and part shape and/or size could be adjusted so as to achieve (at least approximately) the following relationship: $CTE_{Lens\ Assembly} + CTE_{Active\ Alignment\ Bond} + CTE_{Sensor\ Holder} = CTE_{Bond\ Members} + CTE_{Image\ Sensor\ Package} + CTE_{Lens} +$ Temperature Dependent Focal Length of Lens in ppm/° C.

Such passive athermalization steps could be taken to minimize overall CTE mismatch between the various components of the system 100 and to passively maintain the image sensor package 130 substantially at the focal plane of the lens assembly 170 over a wide range of normal operating temperatures (e.g., −40° C. and 85° C.).

In some examples, the system 100 could include a controller. In some embodiments, the controller could be a read-out integrated circuit (ROIC) that is electrically-coupled to the image sensor die 134. The controller includes at least one of a field-programmable gate array (FPGA) or an application-specific integrated circuit (ASIC). Additionally or alternatively, the controller may include one or more processors and a memory. The one or more processors may include a general-purpose processor or a special-purpose processor (e.g., digital signal processors, etc.). The one or more processors may be configured to execute computer-readable program instructions that are stored in the memory. In some embodiments, the one or more processors may execute the program instructions to provide at least some of the functionality and operations described herein.

The memory may include or take the form of one or more computer-readable storage media that may be read or accessed by the one or more processors. The one or more computer-readable storage media can include volatile and/or non-volatile storage components, such as optical, magnetic, organic or other memory or disc storage, which may be integrated in whole or in part with at least one of the one or more processors. In some embodiments, the memory may be implemented using a single physical device (e.g., one optical, magnetic, organic or other memory or disc storage unit), while in other embodiments, the memory can be implemented using two or more physical devices.

As noted, the memory may include computer-readable program instructions that relate to operations of system 100. As such, the memory may include program instructions to perform or facilitate some or all of the functionality described herein. The controller is configured to carry out operations. In some embodiments, controller may carry out the operations by way of the processor executing instructions stored in the memory.

In some examples, the operations could include controlling the image sensor package 130 to capture one or more images by way of the lens assembly 170. Controlling the image sensor package 130 could include adjusting, selecting, and/or instructing the image sensor package 130 to capture the one or more images according to one or more image capture properties. The image capture properties could include a desired aperture, desired exposure time, and/or a desired image sensor light sensitivity (e.g., ISO), among other possibilities.

The controller could be configured to carry out other operations relating to the capture of images using system 100. In some examples, the system 100 could optionally include one or more illumination devices (e.g., light-emitting diodes). In an example embodiment, the controller could coordinate the operation of the illumination devices so as to properly illuminate a scene before and/or during image capture by the image sensor package 130.

Figure 2A:
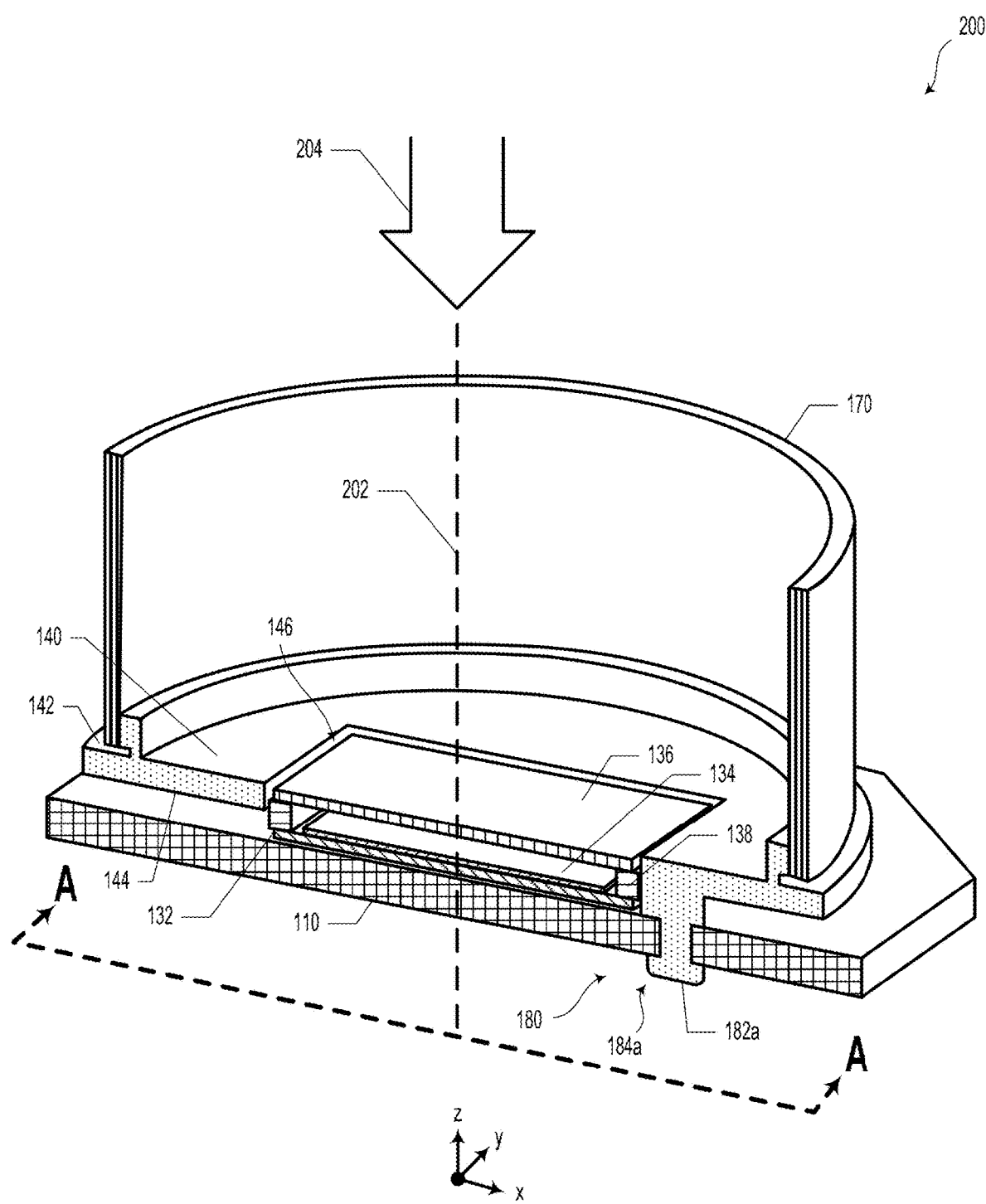
FIG. 2A illustrates a portion of a system, according to an example embodiment.

FIG. 2A illustrates an oblique angle view of a portion of a system 200, according to an example embodiment. The system 200 could include similar or identical elements as that of system 100, as illustrated and described in reference to FIG. 1.

Some example embodiments include an image sensor die 134 that is mounted to an image sensor substrate 132. In some examples, a cover glass 136 could be optically coupled to the image sensor die 134. The cover glass 136 could be spaced apart from a light-sensitive area of the image sensor die 134 along an optical axis 202 by way of one or more spacers 138. The image sensor package 130 could be coupled to the PCBA 110, which could include a printed circuit board material, such as FR-4.

A sensor holder 140 could be coupled to the PCBA 110 by way of a mounting arrangement 180, which could include at least one mounting pin 182a. In such a scenario, the mounting pin 182a could be located at mounting location 184a. In an example embodiment, the sensor holder 140 could be coupled to the PCBA 110 by way of a second sensor holder surface 144. Furthermore, the sensor holder 140 could be coupled to a lens assembly 170 by way of a first sensor holder surface 142. It will be understood that the sensor holder 140 could be coupled to the PCBA 110 by other means as well within the scope of the present disclosure.

In an example embodiment, the lens assembly 170 could include one or more lenses, which could define the optical axis 202. In such scenarios, the image sensor die 134 could be optically-coupled to the environment of the system 200 by way of an opening 146 in the sensor holder 140 and the lens assembly 170. In this way, incident light 204 could interact with the lens assembly 170 and be focused and/or collimated onto the image sensor die 134.

Figure 2B:
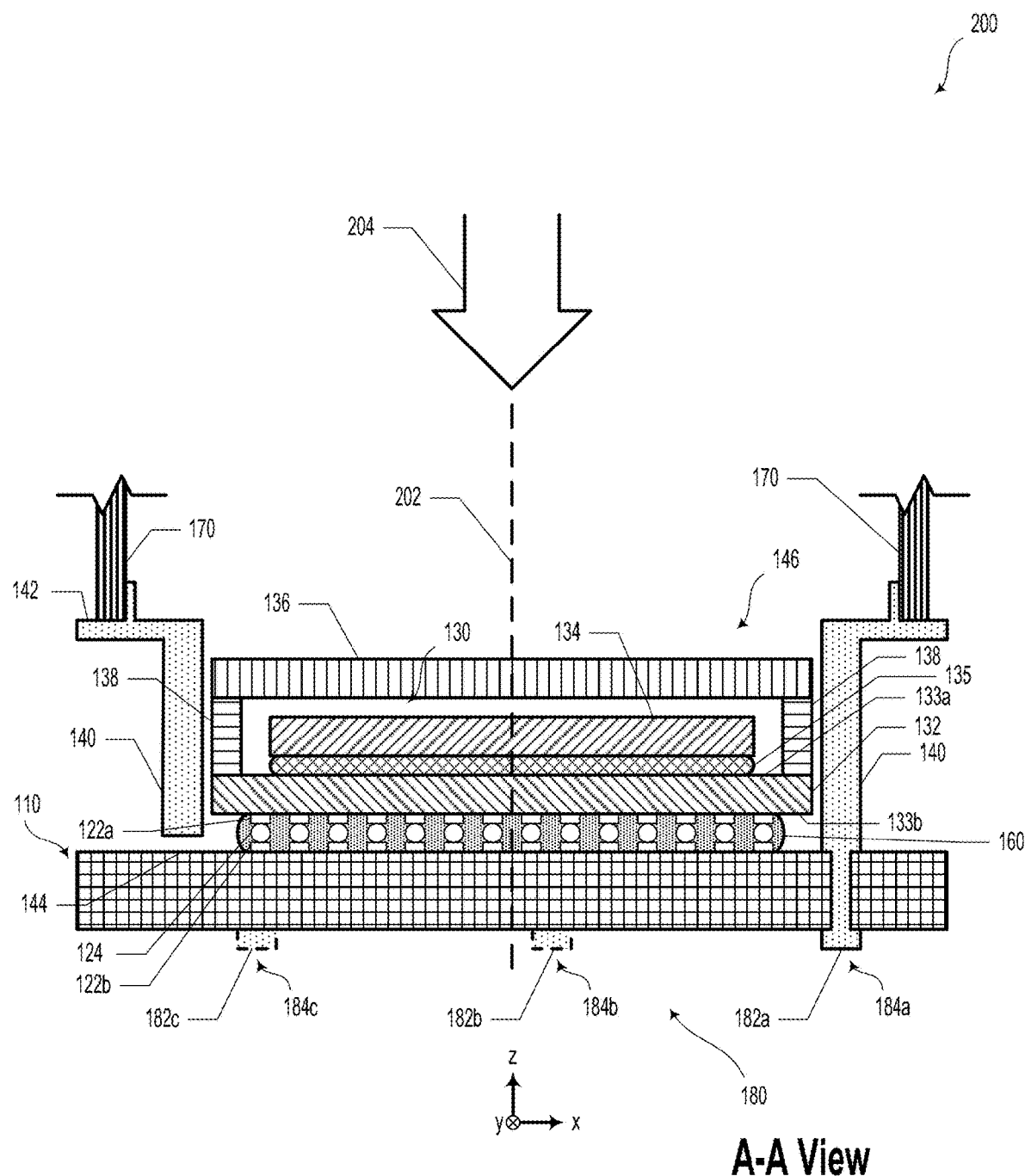
FIG. 2B illustrates a portion of a system, according to an example embodiment.

FIG. 2B illustrates a cross-sectional view of a portion of the system 200, according to an example embodiment. As illustrated, the image sensor package 130 could be coupled to the PCBA 110 by way of a plurality of bond members 120. As described herein, the bond members 120 could include one or more bond pads (e.g., bond pads 122a and 122b). The bond members 120 could include one or more ball bonds (e.g., ball bonds 124). Yet further, the volume between the PCBA 110 and the image sensor package 130 could be filled, at least in part, by way of a filling material such as epoxy, another type of adhesive, or a thermoset material.

FIG. 2B also illustrate a plurality of mounting pins 182a-c, which are respectfully located at mounting locations 184a-184c. In some embodiments, the mounting pins 182a-c could be arranged in a non-equilateral triangle with respect to a plane of the PCBA 110 or the image sensor package 130.

Figure 3:
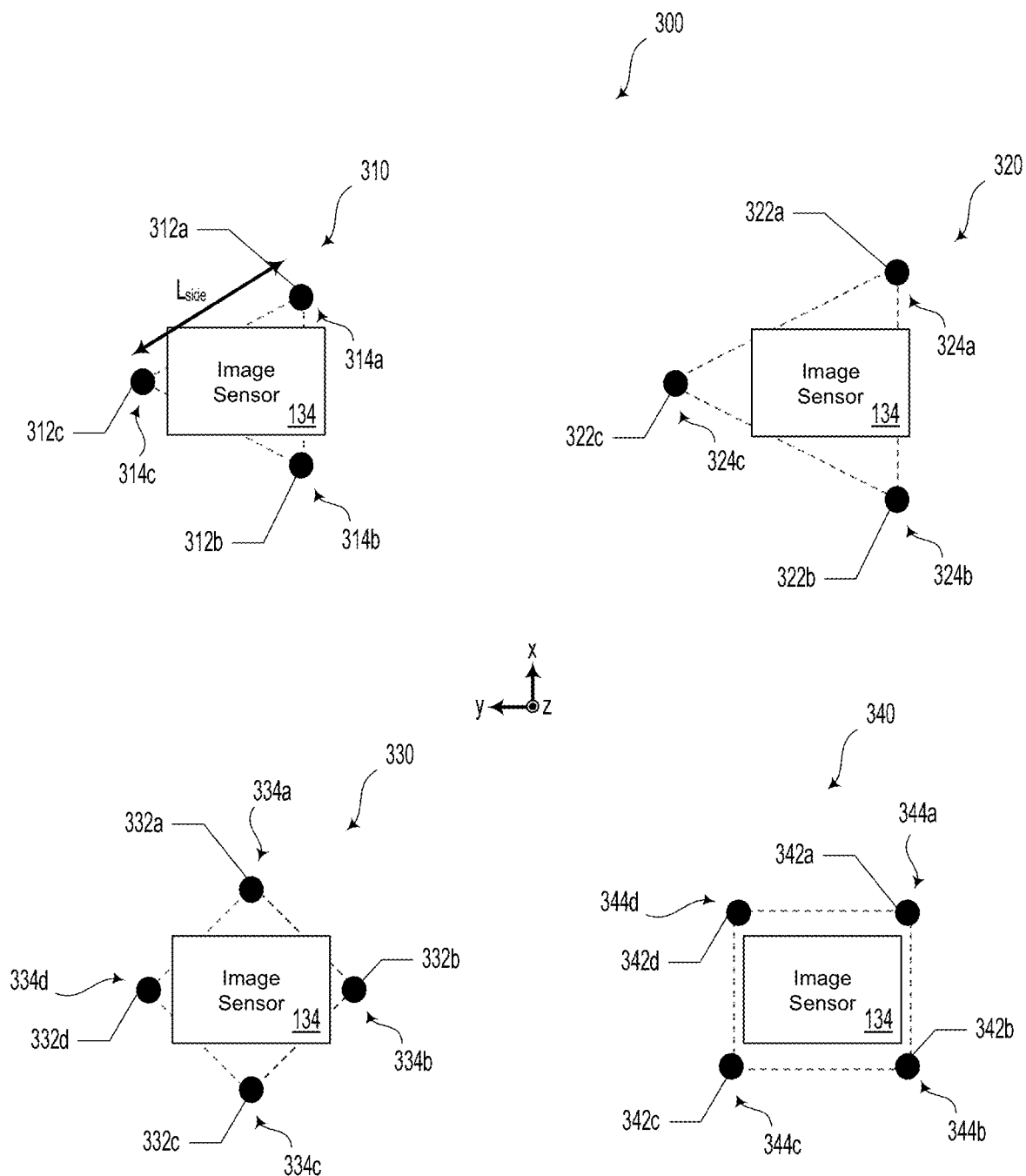
FIG. 3 illustrates various mounting arrangements of a system, according to example embodiments.

FIG. 3 illustrates various mounting arrangements 300 of a system, according to example embodiments. The mounting arrangements 300 could include, for example, various spatial mounting locations for coupling the sensor holder 140 to the PCBA 110 in relation to the location and dimensions of the image sensor die 134 as coupled to the PCBA 110.

Mounting arrangement 310 includes a narrowly spread triangular mounting pattern with respect to the image sensor die 134. In such a scenario, the mounting arrangement 310 could include three mounting pins 312a, 312b, and 312c, which are located at mounting locations 314a, 314b, and 314c, respectively. In an example embodiment, the narrowly spread triangular mounting pattern could include the mounting locations 314a, 314b, and 314c arranged at a respective vertex of an equilateral triangle. In such a scenario, a relative distance between the mounting locations 314a, 314b, and 314c, $L_{side}$, could be approximately 20.8 millimeters (e.g., the equilateral triangle could have a side length of 20.8 millimeters). In other embodiments, the mounting locations could be spaced apart by a distance $L_{side}$ that could range from 10 millimeters to 25 millimeters or more.

Mounting arrangement 320 includes a widely spread triangular mounting pattern with respect to the image sensor die 134. Mounting arrangement 320 could include the mounting locations 324a, 324b, and 324c arranged at the vertices of a non-equilateral triangle. In such a scenario, the mounting arrangement 320 could include three mounting pins 322a, 322b, and 322c, which are located at mounting locations 324a, 324b, and 324c, respectively. As an example, as compared to mounting arrangement 310 (e.g., the narrowly spread triangular mounting pattern described above), mounting arrangement 320 could include mounting location 324a relocated by 3 millimeters in the +x direction (with respect to mounting location 314a), mounting location 324b relocated by 3 millimeters in the −x direction (with respect to mounting location 314b), and mounting location 324c relocated by 3 millimeters in the +y direction (with respect to mounting location 314c). While the mounting arrangement 320 is described specifically with respect to the mounting arrangement 310, it will be understood that a variety of other mounting locations are possible and contemplated within the present disclosure.

Mounting arrangement 330 includes a diamond-shaped mounting pattern with respect to the image sensor die 134. In such a scenario, the mounting arrangement 330 could include four mounting pins 332a, 332b, 332c, and 332d, which are located at mounting locations 334a, 334b, 334c, and 334d, respectively.

Mounting arrangement 340 includes a rectangular-shaped mounting pattern with respect to the image sensor die 134. In such a scenario, the mounting arrangement 340 could include four mounting pins 342a, 342b, 342c, and 342d, which are located at mounting locations 344a, 344b, 344c, and 344d, respectively.

In some embodiments, the various mounting arrangements 300 could provide different amounts and/or spatial gradients of thermally-induced stress on the image sensor die 134 and/or other elements of the systems 100 and 200. As such, the particular mounting arrangement of a given configuration of systems 100 and 200 could be selected based on an estimated thermally-induced fatigue cycle life. As one such example, the widely-spread triangular mounting pattern 320 could be selected based on the estimated cycle life being 10%, 20%, 50%, 100%, or 200% (or more) greater than other comparable system configurations (e.g., compared to system configurations that utilize the rectangular-shaped mounting pattern 340).

It will be understood that other mounting arrangements are possible and contemplated herein. Furthermore, it will be understood that the image sensor die 134 could have a variety of different shapes and sizes. As such, the mounting arrangement 300 could be selected based on the shape and/or size of the image sensor die 134.

Figure 4:
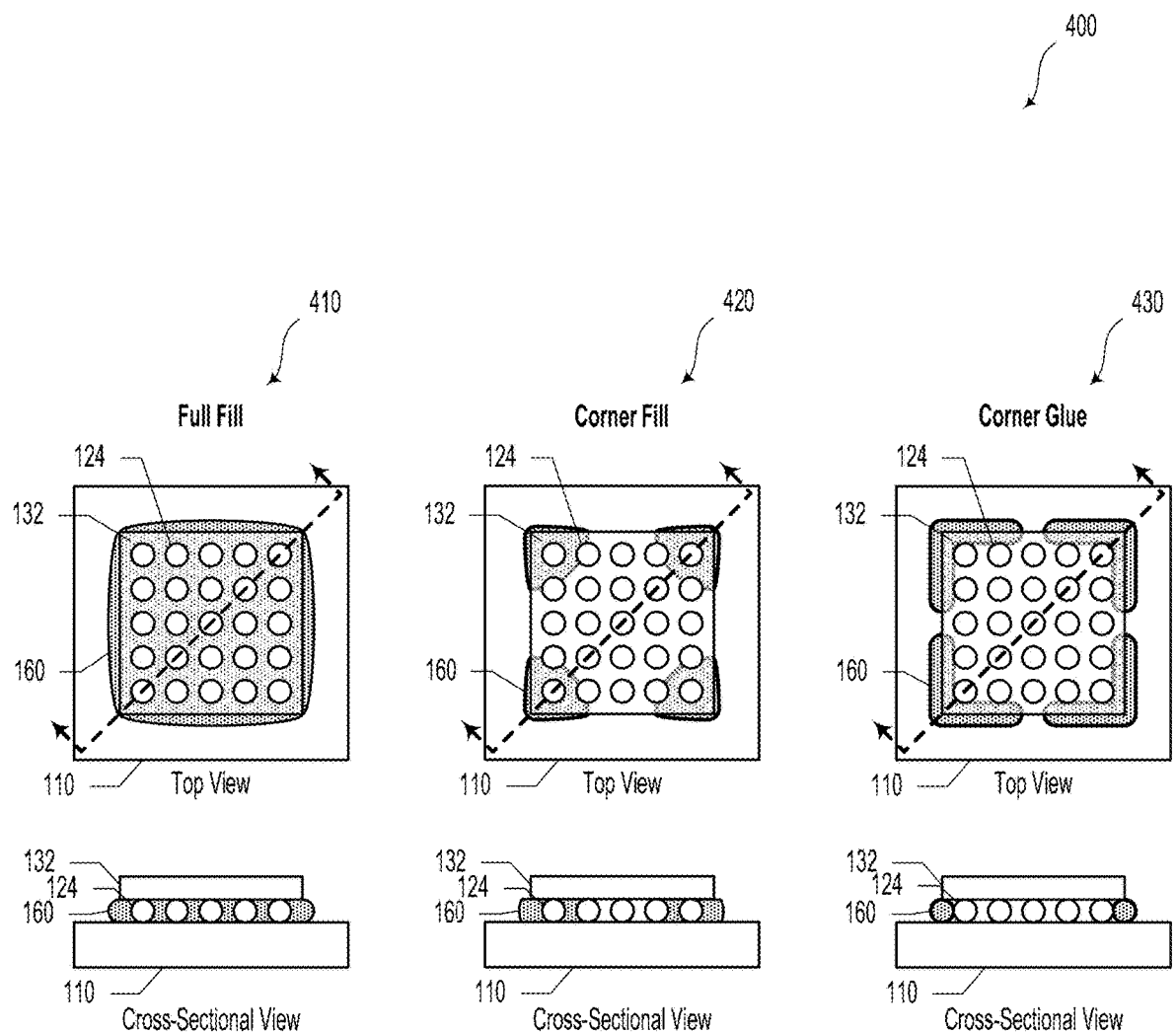
FIG. 4 illustrates various fill patterns, according to example embodiments.
Figure 5A:
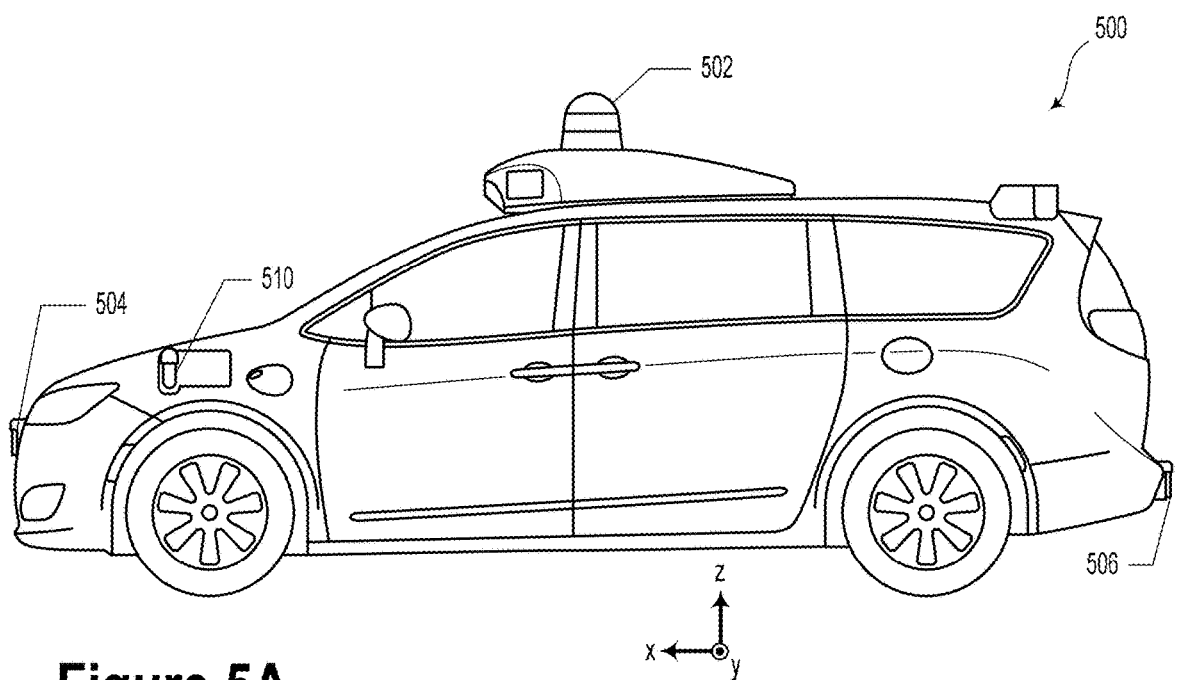
FIG. 5A illustrates a vehicle, according to an example embodiment.
Figure 5B:
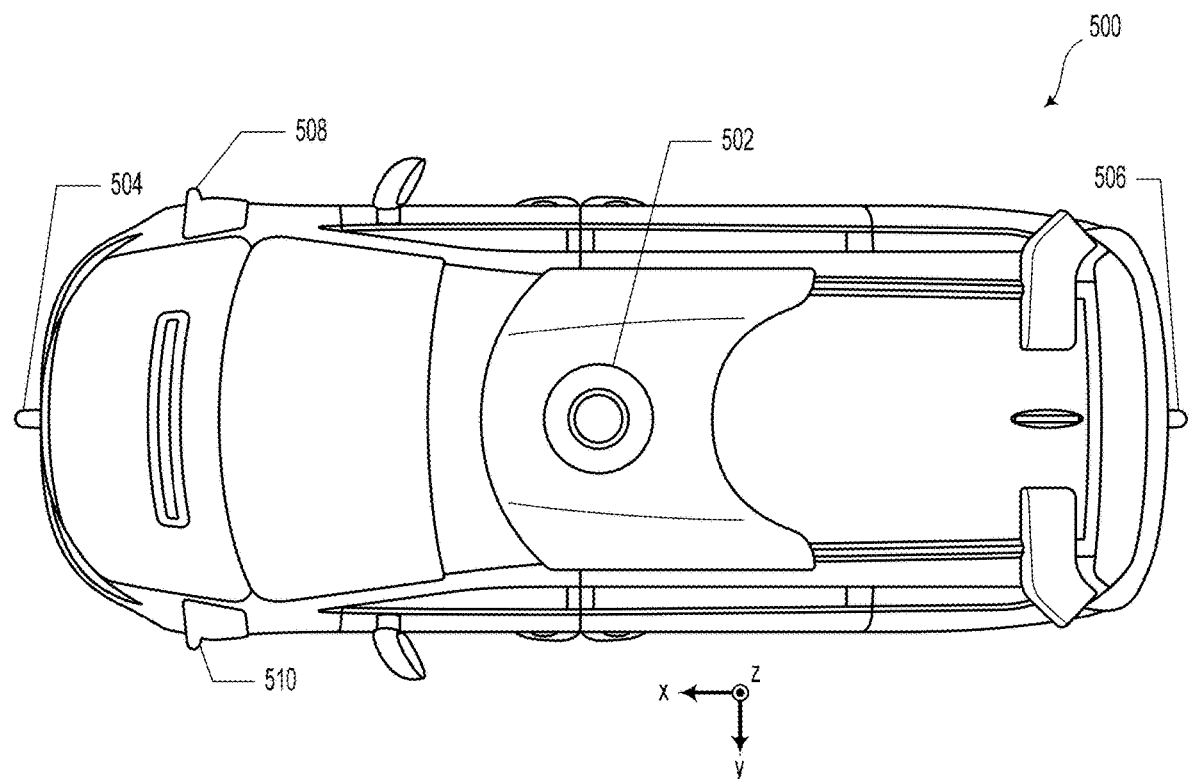
FIG. 5B illustrates a vehicle, according to an example embodiment.
Figure 5C:
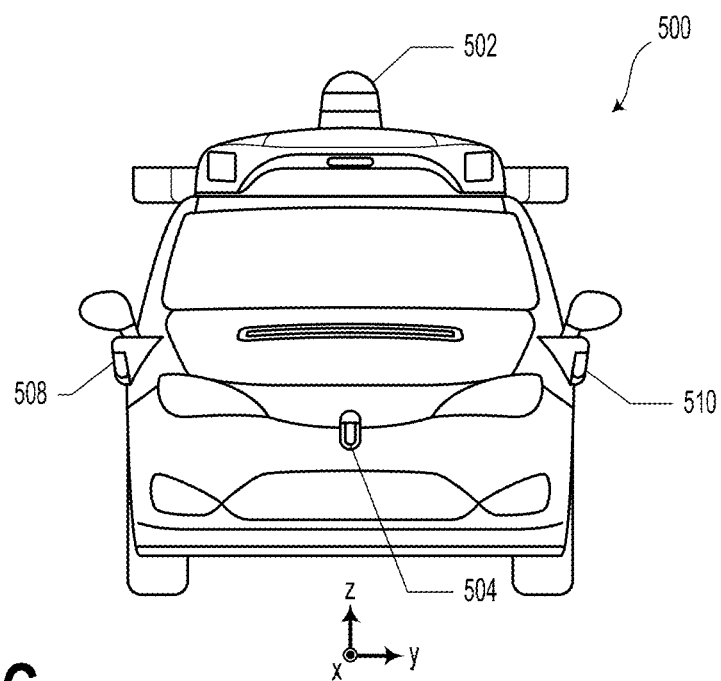
FIG. 5C illustrates a vehicle, according to an example embodiment.
Figure 5D:
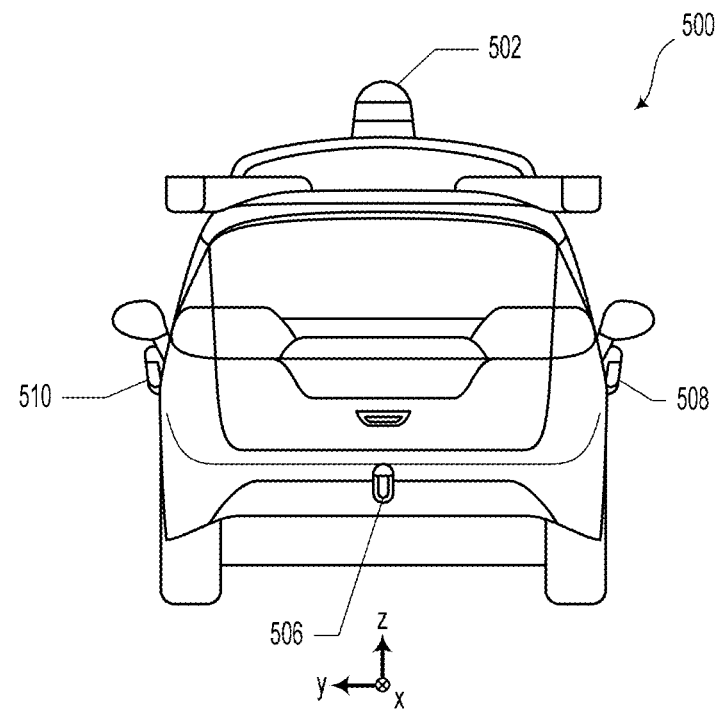
FIG. 5D illustrates a vehicle, according to an example embodiment.
Figure 5E:
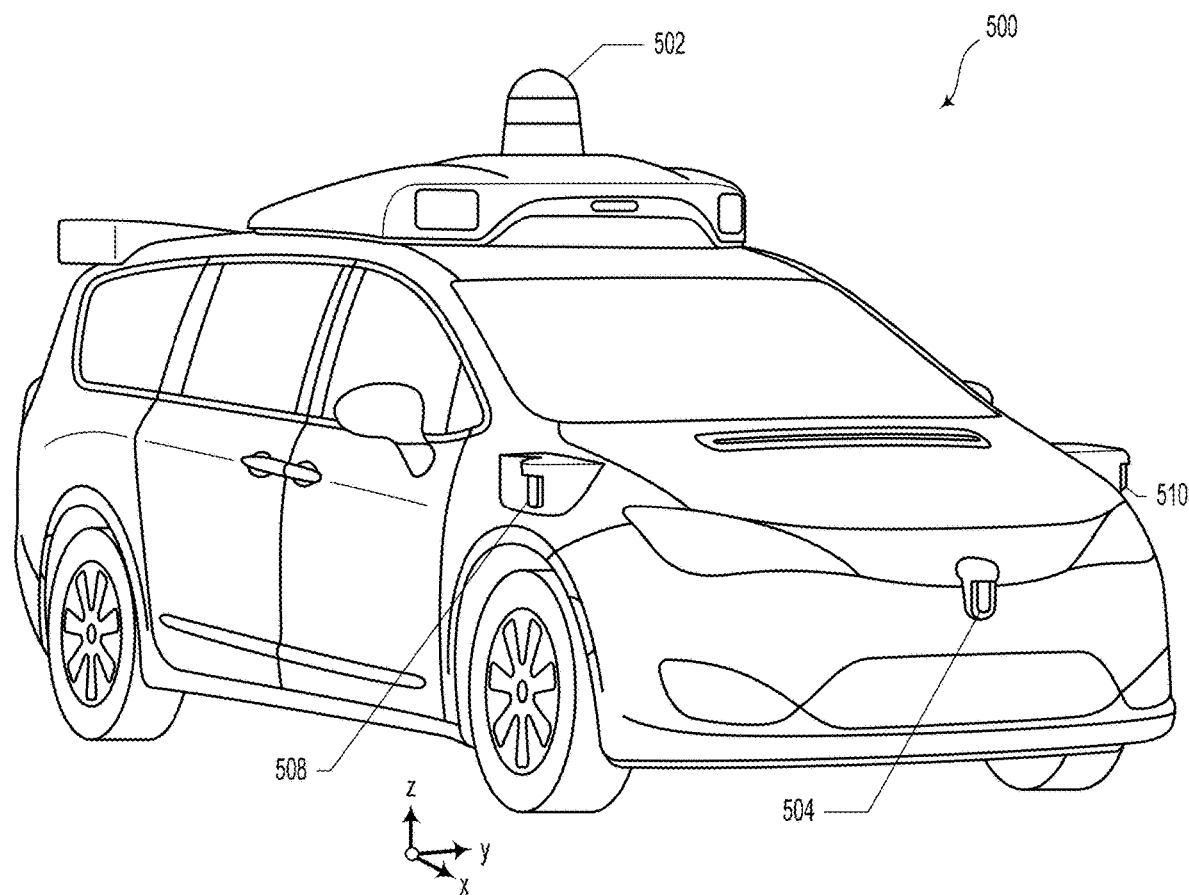
FIG. 5E illustrates a vehicle, according to an example embodiment.

FIG. 4 illustrates overhead and cross-sectional views of various fill patterns 400, according to example embodiments. The various fill patterns 400 could include different ways to apply fill material 160 to a gap between the image sensor substrate 132 and the PCBA 110. As described herein, the fill material 160 could include a thermoset epoxy or another type of underfill material. In some embodiments, the fill material 160 and/or its corresponding CTE and/or thermal conductivity properties could be selected and/or modified so as to reduce, mitigate, and/or eliminate the potential for bond fatigue due to thermal cycling.

Full fill pattern 410 could include substantially filling the entire gap between the image sensor substrate 132 and the PCBA 110 with fill material 160. In such a scenario, the fill material 160 could be chosen and/or applied in such a fashion so as to "wick" easily into the gap between the image sensor substrate 132 and the PCBA 110. In some embodiments, the full fill pattern 410 may provide the best thermal conductivity. However, in some examples, the full fill pattern 410 may provide higher potential for thermally-induced fatigue failure due to CTE mismatch of the fill material 160 as compared to the surrounding materials.

Corner fill pattern 420 could include filling each of the four corners between the image sensor substrate 132 and the PCBA 110 with fill material 160. In such a scenario, the fill material 160 could be chosen and/or applied in such a fashion so as to not as easily "wick" between the image sensor substrate 132 and the PCBA 110. In other words, the viscosity and/or other properties of the fill material 160 could be selected so as to not wick into the gap between substrates. In some embodiments, the corner fill pattern 420 may provide a potential for less thermally-induced fatigue failure due to CTE mismatch of the fill material 160 as compared to that of full fill pattern 410.

Corner glue pattern 430 could include filling only a small area/volume located near the corners between the image sensor substrate 132 and the PCBA 110 with fill material 160. In such a scenario, the fill material 160 could be chosen and/or applied in such a fashion so as to not wick at all into the gap between the image sensor substrate 132 and the PCBA 110. For example, the fill material 160 utilized in a corner glue pattern 430 could be of substantially higher viscosity than that of the fill material 160 utilized in the full fill pattern 410. In some embodiments, the corner glue pattern 430 may provide even more thermal cycles as compared to full fill pattern 410 and/or corner fill pattern 420.

Figure 6:
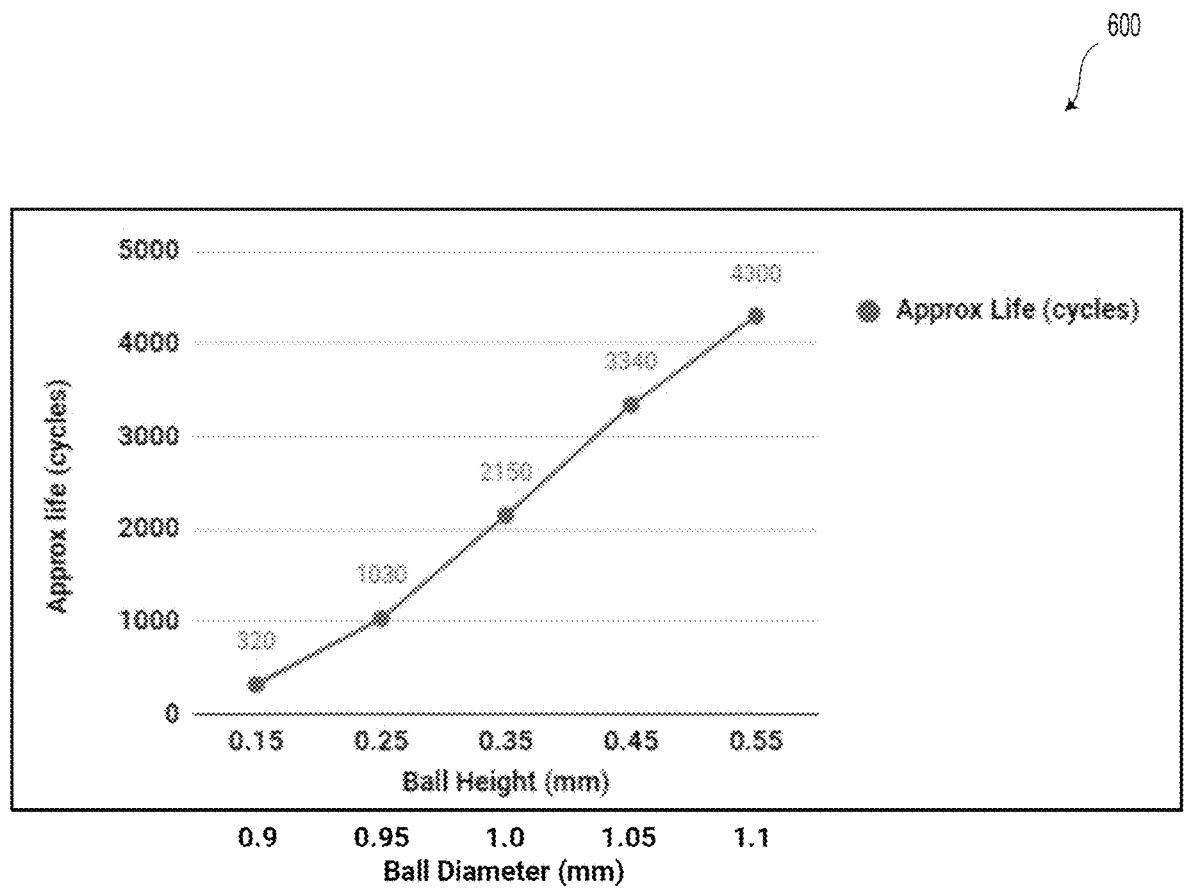
FIG. 6 illustrates approximate bond thermal cycle life versus ball height and ball diameter, according to example embodiments.

FIG. 6 illustrates a graph 600 showing approximate bond thermal cycle life versus ball height and ball diameter, according to example embodiments. Various simulations indicate that the approximate thermal cycle life of a given electrical bond is monotonically increasing with ball bond height and ball bond diameter. For example, as illustrated in graph 600, such simulations indicate that as ball bond diameter increases from 0.9 mm-1.1 mm, the approximate life cycles of the given bond increases from 320 cycles to 4300 cycles, more than a 10-fold increase in cycle life. As indicated in graph 600, the respective ball heights that correspond to the ball bond diameter increase from 0.15 mm to 0.55 mm.

FIG. 7 illustrates a comparison 700 between several system configurations, according to example embodiments. For example, the comparison 700 illustrates various model configurations (e.g., LGA old PCB, LGA new PCB, LGA new+underfill, and BGA new PCB). The comparison 700 includes several columns include the total strain, the stress at a critical solder joint (MPa), average volume strain energy density per cycle, a first model (e.g., Schubert's model) predicting cycle life, a second model (e.g., Syed's model) predicting cycle life, and a life cycle test. As illustrated in the comparison 700, a LGA array utilized in conjunction with underfilling with fill material (e.g., fill material 160) may provide the greatest cycle life due to low strain energy density.

Figure 8:
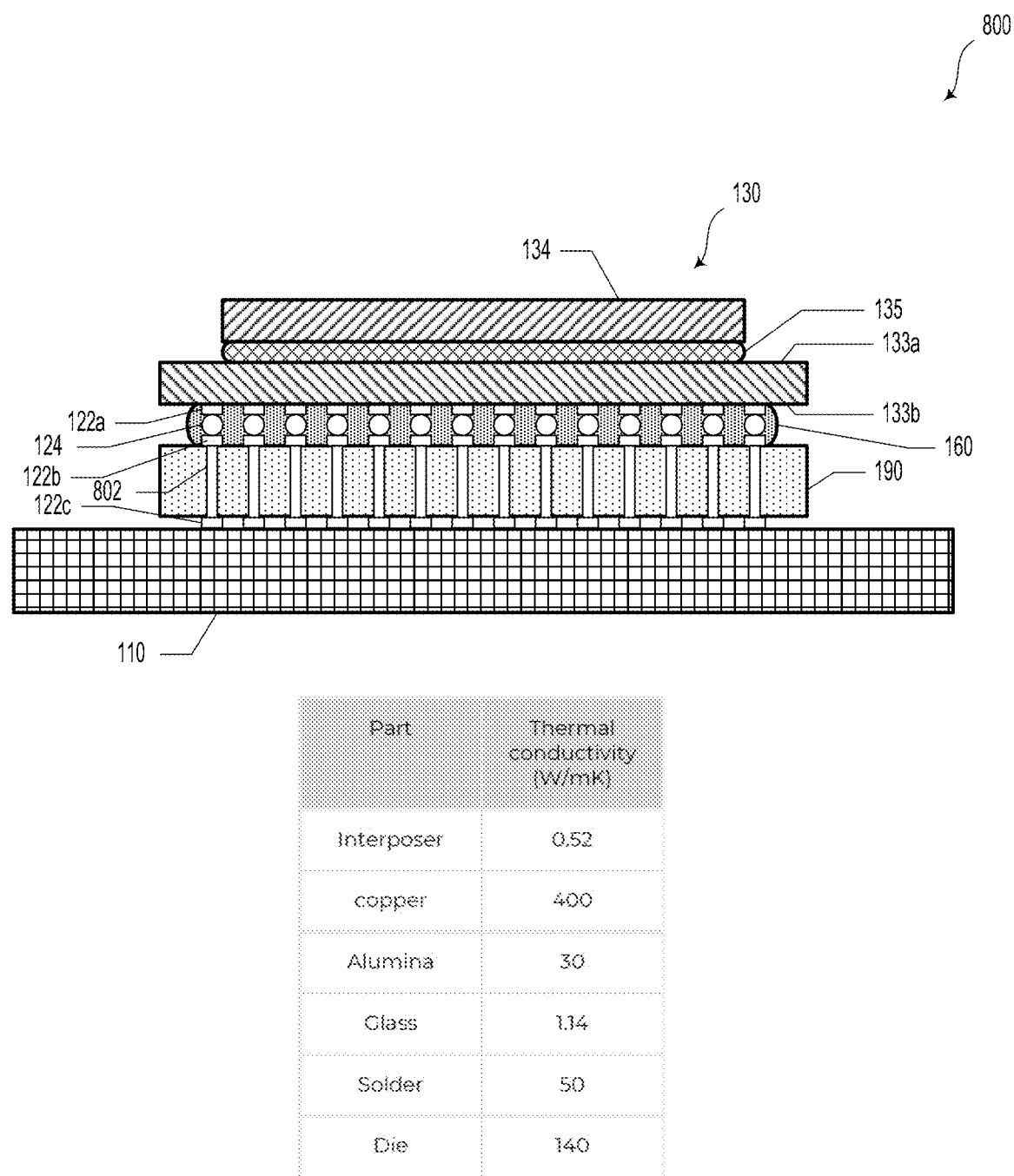
FIG. 8 illustrates a portion of a system, according to an example embodiment.

FIG. 8 illustrates a portion of a system 800, according to an example embodiment. In some embodiments, system 800 could include elements that are similar or identical to that of systems 100 and 200, as illustrated and described in relation to FIGS. 1, 2A, and 2B. For example, system 800 includes an image sensor package 130 and a PCBA 110.

As illustrated in FIG. 8, system 800 may also include an interposer 190. The interposer 800 could include a substantially planar substrate having a desired thermal conductivity. In some embodiments, the desired thermal conductivity could be relatively low (e.g., 0.52 W/mK) as compared to other materials making other elements of system 800. In some embodiments, the interposer 190 could include a plurality of through hole vias (THVs) 802, which could provide electrical and/or thermal conductivity between the PCBA 110 and the image sensor substrate surface 133b. In an example embodiment, the THVs 802 could be filled with copper or another electrically-conductive material. In some embodiments, THVs 802 could each have a diameter of 200 microns and a length of 940 microns. It will be understood that other dimensions of the THVs 802 are contemplated and possible.

System 800 may include a plurality of bond pads (e.g., 122a, 122b, and 122c) and/or a plurality of ball bond members (e.g., ball bond member 124).

In some embodiments, by utilizing an interposer 190, system 800 may have a much higher number of predicted thermal cycles (e.g., 2×, 10×, or 100× as compared to without an interposer) prior to bond fatigue and/or bond failure.

In some embodiments, one or more units incorporating system 100 could be attached or otherwise mounted to a vehicle, as described below.

III. Example Vehicles

FIGS. 5A, 5B, 5C, 5D, and 5E illustrate a vehicle 500, according to an example embodiment. The vehicle 500 could be a semi- or fully-autonomous vehicle. While FIG. 5 illustrates vehicle 500 as being an automobile (e.g., a passenger van), it will be understood that vehicle 500 could include another type of autonomous vehicle, robot, or drone that can navigate within its environment using sensors and other information about its environment.

The vehicle 500 may include one or more sensor systems 502, 504, 506, 508, and 510. In some embodiments, sensor systems 502, 504, 506, 508, and 510 could include systems 100 and/or 200 as illustrated and described in relation to FIGS. 1, 2A, and 2B. In other words, the image sensor systems described elsewhere herein could be coupled to the vehicle 500 and/or could be utilized in conjunction with various operations of the vehicle 500. As an example, the systems 100 and 200 could be utilized in self-driving or other types of navigation, planning, and/or mapping operations of the vehicle 500.

While the one or more sensor systems 502, 504, 506, 508, and 510 are illustrated on certain locations on vehicle 500, it will be understood that more or fewer sensor systems could be utilized with vehicle 500. Furthermore, the locations of such sensor systems could be adjusted, modified, or otherwise changed as compared to the locations of the sensor systems illustrated in FIGS. 5A, 5B, 5C, 5D, and 5E.

In some embodiments, the one or more sensor systems 502, 504, 506, 508, and 510 could additionally or alternatively include LIDAR sensors. For example, the LIDAR sensors could include a plurality of light-emitter devices arranged over a range of angles with respect to a given plane (e.g., the x-y plane). For example, one or more of the sensor systems 502, 504, 506, 508, and 510 may be configured to rotate about an axis (e.g., the z-axis) perpendicular to the given plane so as to illuminate an environment around the vehicle 500 with light pulses. Based on detecting various aspects of reflected light pulses (e.g., the elapsed time of flight, polarization, intensity, etc.), information about the environment may be determined.

In an example embodiment, sensor systems 502, 504, 506, 508, and 510 may be configured to provide respective point cloud information that may relate to physical objects within the environment of the vehicle 500. While vehicle 500 and sensor systems 502, 504, 506, 508, and 510 are illustrated as including certain features, it will be understood that other types of sensor systems are contemplated within the scope of the present disclosure.

An example embodiment may include a system having a plurality of light-emitter devices. The system may include a transmit block of a LIDAR device. For example, the system may be, or may be part of, a LIDAR device of a vehicle (e.g., a car, a truck, a motorcycle, a golf cart, an aerial vehicle, a boat, etc.). Each light-emitter device of the plurality of light-emitter devices is configured to emit light pulses along a respective beam elevation angle. The respective beam elevation angles could be based on a reference angle or reference plane, as described elsewhere herein. In some embodiments, the reference plane may be based on an axis of motion of the vehicle 500.

While LIDAR systems with single light-emitter devices are described and illustrated herein, LIDAR systems with multiple light-emitter devices (e.g., a light-emitter device with multiple laser bars on a single laser die) are also contemplated. For example, light pulses emitted by one or more laser diodes may be controllably directed about an environment of the system. The angle of emission of the light pulses may be adjusted by a scanning device such as, for instance, a mechanical scanning mirror and/or a rotational motor. For example, the scanning devices could rotate in a reciprocating motion about a given axis and/or rotate about a vertical axis. In another embodiment, the light-emitter device may emit light pulses towards a spinning prism mirror, which may cause the light pulses to be emitted into the environment based on an angle of the prism mirror angle when interacting with each light pulse. Additionally or alternatively, scanning optics and/or other types of electro-opto-mechanical devices are possible to scan the light pulses about the environment.

In some embodiments, a single light-emitter device may emit light pulses according to a variable shot schedule and/or with variable power per shot, as described herein. That is, emission power and/or timing of each laser pulse or shot may be based on a respective elevation angle of the shot. Furthermore, the variable shot schedule could be based on providing a desired vertical spacing at a given distance from the LIDAR system or from a surface (e.g., a front bumper) of a given vehicle supporting the LIDAR system. As an example, when the light pulses from the light-emitter device are directed downwards, the power-per-shot could be decreased due to a shorter anticipated maximum distance to target. Conversely, light pulses emitted by the light-emitter device at an elevation angle above a reference plane may have a relatively higher power-per-shot so as to provide sufficient signal-to-noise to adequately detect pulses that travel longer distances.

In some embodiments, the power/energy-per-shot could be controlled for each shot in a dynamic fashion. In other embodiments, the power/energy-per-shot could be controlled for successive set of several pulses (e.g., 10 light pulses). That is, the characteristics of the light pulse train could be changed on a per-pulse basis and/or a per-several-pulse basis.

While FIGS. 5A-5E illustrate various sensors attached to the vehicle 500, it will be understood that the vehicle 500 could incorporate other types of sensors.

IV. Example Methods of Manufacture

Figure 9:
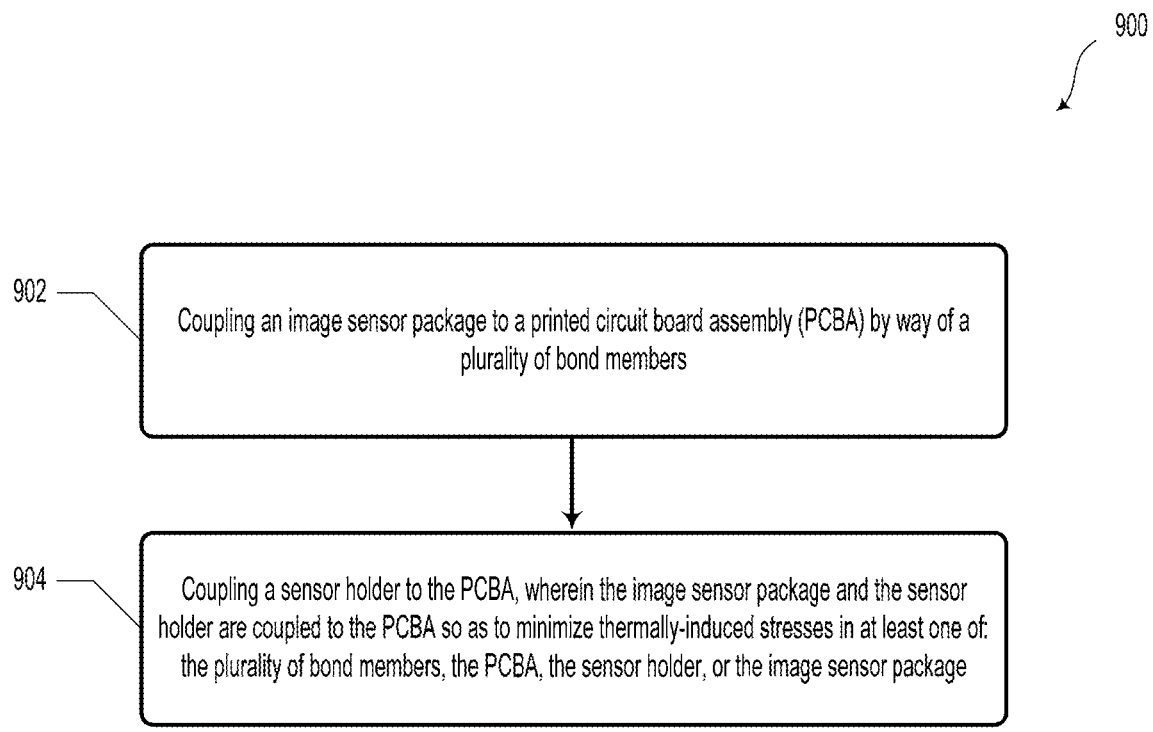
FIG. 9 illustrates a method, according to an example embodiment.
Figure 10A:
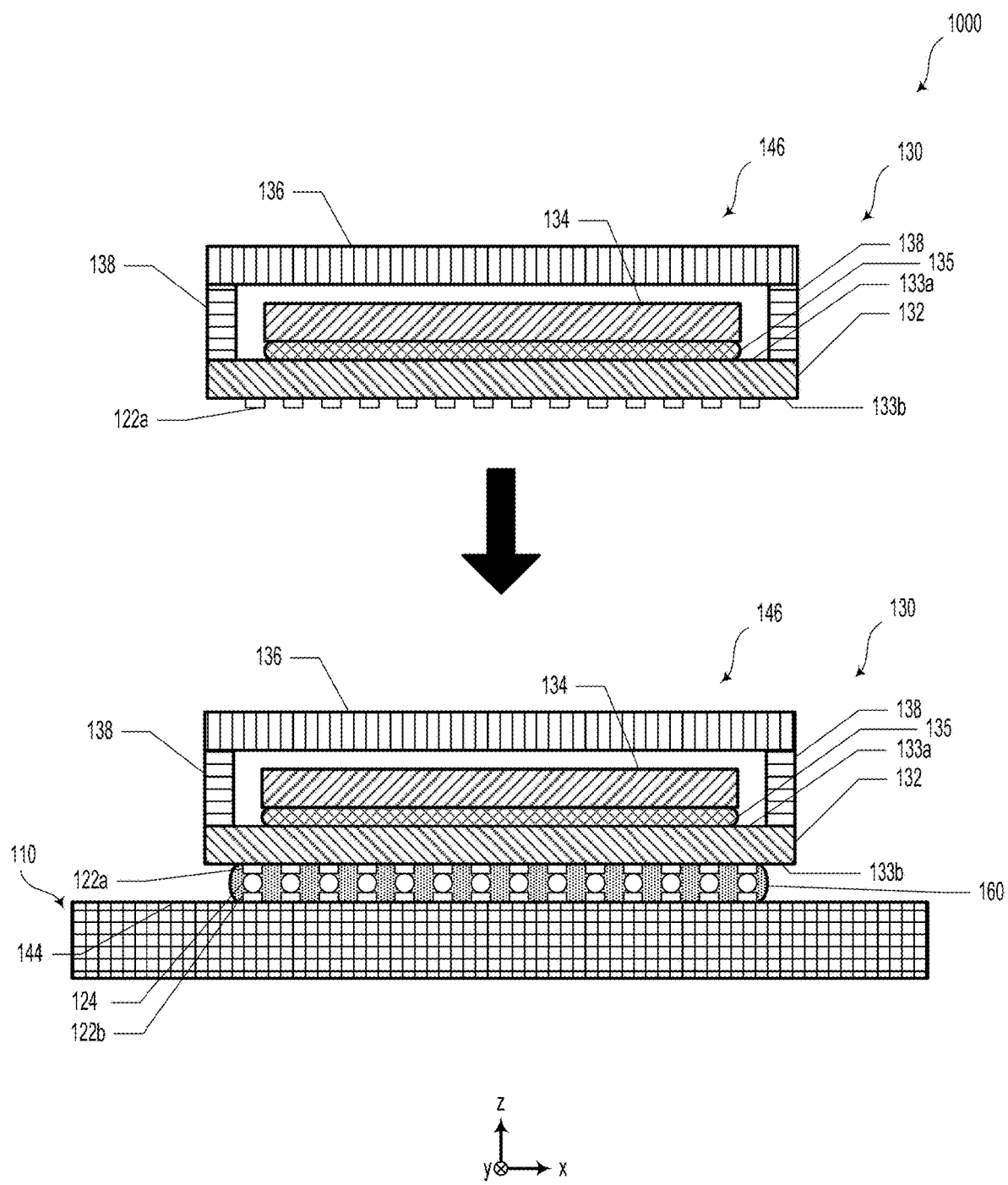
FIG. 10A illustrates a portion of the method of FIG. 9, according to an example embodiment.
Figure 10B:
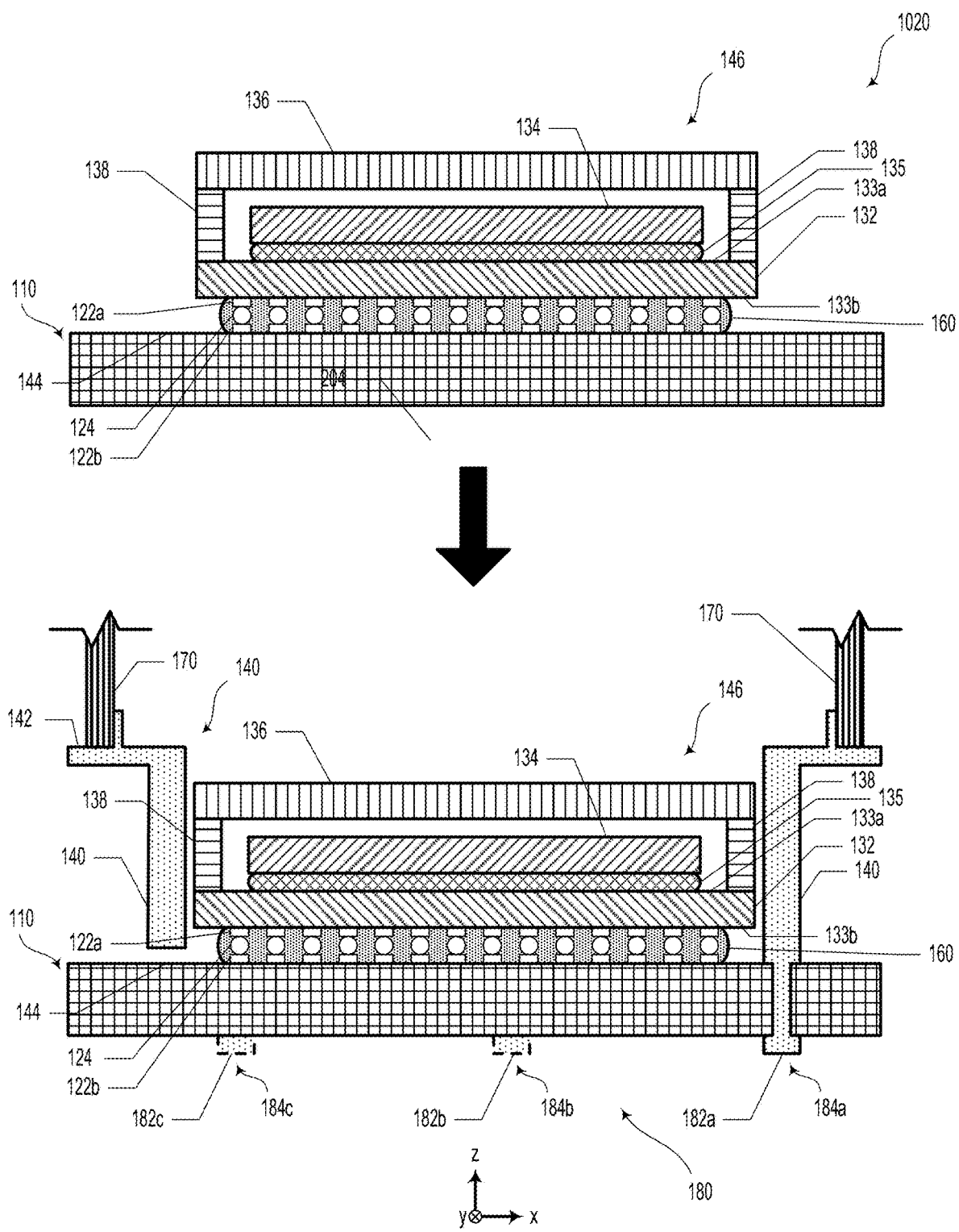
FIG. 10B illustrates a portion of the method of FIG. 9, according to an example embodiment.

FIG. 9 illustrates a method 900, according to an example embodiment. Method 900 could include a method of manufacturing an optical system. FIGS. 10A and 10B illustrate one or more blocks of the method 900 of FIG. 9, according to an example embodiment. It will be understood that the method 900 may include fewer or more steps or blocks than those expressly illustrated or otherwise disclosed herein. Furthermore, respective steps or blocks of method 900 may be performed in any order and each step or block may be performed one or more times. In some embodiments, some or all of the blocks or steps of method 900 may relate to elements of the system 100 and/or the vehicle 500 as illustrated and described in relation to FIGS. 1, 2A, 2B, 5A, 5B, 5C, 5D, and 5E.

Block 902 includes coupling an image sensor package (e.g., image sensor package 130) to a printed circuit board assembly (PCBA) (e.g., PCBA 110) by way of a plurality of bond members (e.g., bond members 120). In some embodiments, coupling the image sensor package to the PCBA could be performed by way of a plurality of bond pads (e.g., bond pads 122), which could be arranged in a LGA or another bond pad configuration. Alternatively or additionally, coupling the image sensor package to the PCBA could utilize a plurality of ball bond members (e.g., ball bond members 124). For example, in such scenarios, the ball bond members could have a diameter between 500 microns to 1500 microns. Additionally or alternatively, the ball bond members could have a ball height between 100 microns and 750 microns. It will be understood that other ball bond member sizes and/or shapes are possible and contemplated herein.

In reference to FIG. 10A, scenario 1000 illustrates coupling of an image sensor package 130 (e.g., image sensor substrate 132, image sensor die 134, etc.) to a printed circuit board assembly 110. Namely, the image sensor package 130 could be coupled to the PCBA 110 by way of a plurality of bond members 120, which could include bond pads 122A, bond pads 122b, and/or ball bond members 124. As illustrated in FIG. 10A, the plurality of bond members 120 could, at least in part, be filled with a fill material 160 (e.g., an underfill epoxy). It will be understood that the fill material 160 could include a thermoset epoxy or another type of underfill material. In some embodiments, the fill material 160 could be selected so as to reduce, mitigate, and/or eliminate the potential for bond fatigue due to thermal cycling.

Block 904 includes coupling a sensor holder to the PCBA. In such a scenario, the image sensor package and the sensor holder are coupled to the PCBA so as to minimize thermally-induced stresses in at least one of: the plurality of bond members, the PCBA, the sensor holder, or the image sensor package. In some embodiments, the sensor holder could be coupled to the PCBA by way of a mounting arrangement (e.g., mounting arrangement 180), which may include one or more fasteners (e.g., nuts, bolts, pins, etc.).

In reference to FIG. 10B, scenario 1020 illustrates coupling a sensor holder 140 to PCBA 110. As illustrated, FIG.

10B includes coupling the sensor holder 140 to the PCBA 110 by way of a mounting pin 182a, which is located at a mounting location 184a. As described herein, the mounting arrangement 180 could include three, four, five, or more mounting pins 182 that couple to the PCBA 110. However, other arrangements are possible and contemplated.

In some embodiments, method 900 could further include forming a respective ball bond member on a respective bond pad along a backside of the image sensor package. In such scenarios, each bond member of the plurality of bond members could include the respective bond pad coupled to the respective ball bond member.

In various embodiments, method 900 could also include providing the image sensor package. In example embodiments, the image sensor package could include an image sensor substrate having a first surface and a second surface and an image sensor die. The image sensor die is coupled to the first surface of the image sensor substrate by way of a die attach material. The image sensor package could also include a cover glass and a spacer. The spacer is disposed about a perimeter of the image sensor die. Furthermore, the spacer is disposed between the first surface of the image sensor substrate and a surface of the cover glass.

In some embodiments, method 900 may additionally include filling at least a portion of a cavity between the PCBA and the image sensor package with a fill material. In some embodiments, the fill material could include, without limitation, at least one of an epoxy material or a CTE-matching material.

Furthermore, filling the at least a portion of the cavity between the PCBA and the image sensor package is performed according to a fill pattern. The fill pattern could include at least one of: a full area fill, a corner area fill, or a corner edge bond.

In example embodiments, method 900 also includes further comprising coupling a lens assembly to the sensor holder, wherein the sensor holder comprises an opening configured to provide optical access between the lens assembly and the image sensor package.

In various embodiments, method 900 may include attaching the sensor holder to the PCBA according to a mounting arrangement. The mounting arrangement could include, for example, a plurality of mounting pins that couple the sensor holder to the PCBA at a plurality of mounting locations. In such scenarios, the mounting arrangement is selected so as to minimize thermally-induced stress between the PCBA and the sensor holder. In some embodiments, the mounting arrangement could include three mounting locations disposed in a non-equilateral triangle with respect to the image sensor package.

FIG. 10B illustrates a portion of the method of FIG. 9, according to an example embodiment.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
a printed circuit board assembly (PCBA) having a PCBA planar coefficient of thermal expansion (CTE); an image sensor package coupled to the PCBA by way of a plurality of bond members, the image sensor package having an image sensor planar CTE that is substantially similar to the PCBA planar CTE to reduce thermally-induced stresses in the plurality of bond members, the image sensor package, and the PCBA, wherein a gap between the PCBA and an image sensor substrate of the image sensor package is filled with a fill material according to a corner glue pattern; a sensor holder coupled to the PCBA; and a lens assembly coupled to the sensor holder, wherein the sensor holder comprises an opening configured to provide optical access between the lens assembly and the image sensor package.

2. The system of claim 1, wherein each bond member of the plurality of bond members comprises: a respective bond pad coupled to a surface of the image sensor package; and a respective ball bond member coupled between the respective bond pad and the PCBA.

3. The system of claim 1, wherein the PCBA comprises: a plurality of electrically-insulating laminate layers; and a plurality of electrically-conducting laminate layers.

4. The system of claim 1, wherein the PCBA planar CTE is within one percent of the image sensor planar CTE.

5. The system of claim 1, wherein the image sensor package comprises:
an image sensor substrate having a first surface and a second surface; an image sensor die, wherein the image sensor die is coupled to the first surface of the image sensor substrate by way of a die attach material; a cover glass; an a spacer, wherein the spacer is disposed about a perimeter of the image sensor die and wherein the spacer is disposed between the first surface of the image sensor substrate and a surface of the cover glass.

6. The system of claim 5, wherein the second surface of the image sensor substrate comprises a plurality of land grid array (LGA) pads.

7. The system of claim 1, wherein the fill material comprises CTE-matching material.

8. The system of claim 1, wherein the sensor holder is attached to the PCBA by way of a mounting arrangement, wherein the mounting arrangement comprises a plurality of mounting pins that couple the sensor holder to the PCBA at a plurality of mounting locations, wherein the mounting arrangement is selected so as to minimize thermally-induced stress between the PCBA and the sensor holder.

9. The system of claim 8, wherein the mounting arrangement comprises three mounting locations disposed in a non-equilateral triangle with respect to the image sensor package.

10. The system of claim 1, wherein, to further reduce the thermally-induces stresses, a summation of the image sensor planar CTE, a CTE of the plurality of bond members, and a CTE of a lens is approximately equal to a summation of a CTE of the sensor holder, a CTE of an active alignment bond that couples the sensor holder to the PCBA, and a CTE of a lens assembly.

11. A method of manufacturing an optical system, the method comprising: coupling an image sensor package to a printed circuit board assembly (PCBA) by way of a plurality of bond members, the image sensor package having an image sensor planar coefficient of thermal expansion (CTE) that is substantially similar to a PCBA planar CTE of the PCBA to reduce thermally-induced stresses in the plurality of bond members, the image sensor package, and the PCBA; partially filling a gap between the PCBA and an image sensor substrate of the image sensor package with a fill material according to a corner glue pattern, wherein partially filling the gap according to the corner pattern comprises filling areas in the gap that are proximate to corners of the image sensor substrate and the PCBA with the fill material; and coupling a sensor holder to the PCBA.

12. The method of claim 11, further comprising forming the plurality of bond members, wherein forming each bond member comprises: coupling a respective bond pad to a surface of the image sensor package; and coupling a respective ball member to the respective bond pad.

13. The method of claim 11, wherein the fill material comprises a CTE-matching material.

14. The method of claim 11, wherein the fill material has a higher viscosity than that of a conventional fill material utilized in a full fill pattern.

15. The method of claim 11, further comprising coupling a lens assembly to the sensor holder, wherein the sensor holder comprises an opening configured to provide optical access between the lens assembly and the image sensor package.

16. The method of claim 11, further comprising attaching the sensor holder to the PCBA according to a mounting arrangement, wherein the mounting arrangement comprises a plurality of mounting pins that couple the sensor holder to the PCBA at a plurality of mounting locations, wherein the mounting arrangement is selected so as to minimize thermally-induced stress between the PCBA and the sensor holder, wherein the mounting arrangement comprises three mounting locations disposed in a non-equilateral triangle with respect to the image sensor package.

17. The method of claim 11, wherein the corner pattern reduces wicking between the image sensor substrate and the PCBA.

18. The method of claim 11, wherein the fill material comprises a high viscosity fill material.

* * * * *

UNITED STATES PATENT AND TRADEMARK OFFICE
CERTIFICATE OF CORRECTION

| | | |
|---|---|---|
| PATENT NO. | : 11,206,732 B2 | Page 1 of 1 |
| APPLICATION NO. | : 16/460963 | |
| DATED | : December 21, 2021 | |
| INVENTOR(S) | : Matthew Last et al. | |

It is certified that error appears in the above-identified patent and that said Letters Patent is hereby corrected as shown below:

In the Claims

In Claim 1, Column 16, Line 39, please delete "glue".

In Claim 11, Column 17, Line 31, please delete "glue".

Signed and Sealed this
Tenth Day of May, 2022

Katherine Kelly Vidal
*Director of the United States Patent and Trademark Office*